United States Patent [19]
Melliar-Smith

[11] 3,998,718
[45] Dec. 21, 1976

[54] ION MILLING APPARATUS

[75] Inventor: Christopher Mark Melliar-Smith, Morris, N.J.

[73] Assignee: Bell Telephone Laboratories, Incorporated, Murray Hill, N.J.

[22] Filed: Feb. 18, 1976

[21] Appl. No.: 659,042

[52] U.S. Cl. .................. 204/298; 219/121 EB; 219/121 P

[51] Int. Cl.² ........................ C23C 15/00

[58] Field of Search ............ 204/298, 192; 219/121 EB, 121 EM, 121 P; 118/49.1, 49.5, 50.1; 427/38; 313/231.3; 250/492

[56] References Cited

UNITED STATES PATENTS

| | | | |
|---|---|---|---|
| 3,501,393 | 3/1970 | Wehner et al. | 204/298 |
| 3,652,443 | 3/1972 | Fish et al. | 204/298 |
| 3,684,678 | 8/1972 | Beardmore et al. | 204/192 |
| 3,708,418 | 1/1973 | Quinn | 204/298 |

FOREIGN PATENTS OR APPLICATIONS 1,294,697 11/1972 United Kingdom ........... 204/298

OTHER PUBLICATIONS

P. G. Gloersen, "Ion Beam Etching", *J. Vac. Sci. Technol.* vol. 12, No. 1, Jan./Feb. 1975, pp. 28-35.
H. L. Garvin, "High Resolution Fabrication by Ion Beam Sputtering", *Solid State Technology*, Nov. 1973, pp. 31-36.

*Primary Examiner*—John H. Mack
*Assistant Examiner*—Aaron Weisstuch
*Attorney, Agent, or Firm*—Peter V. D. Wilde

[57] ABSTRACT

To adapt ion milling of thin film devices to the requirements of large scale industrial production a configuration of ion source and device holders is proposed which allows the simultaneous processing of a large number of devices. In the proposed configuration ions are emitted radially from a cylindrical source and strike surfaces to be patterned on devices attached to device holders which rotate and revolve around the ion source in planetary fashion.

5 Claims, 2 Drawing Figures

3,998,718 ions to the particles constituting the exposed surface rather than by chemical reaction. The ion beam is produced by means of an ion gun in which a suitable gas such as argon is ionized by electron impact and in which the ions so produced are accelerated by means of a stationary electric field. To prevent chemical interaction between the gas and the layer being etched, it is advantageous to choose one of the noble gases as etchant gas; however, reactive gases such as oxygen have also proven effective.

ION MILLING APPARATUS

BACKGROUND OF THE INVENTION

1. Field of the Invention

The invention is concerned with apparatus for patterning surfaces by selective removal of surface material.

2. Description of the Prior Art

The manufacture of miniaturized electromagnetic signal processing devices depends to a large extent on methods for patterning layers of metallic, semiconducting, and insulating materials. Such patterning may be carried out chemically by so-called wet etching with a suitable agent in the presence of a mask. The mask prevents contact between the etchant and portions of the layer being etched and thereby prevents underlying areas of the layer from being etched away. Alternatively, patterning may be effected by sputter-etching or by ion-milling as disclosed in U.S. Pat. No. 3,860,783. This latter method utilizes a wide-aperture beam of ions, parallel to within $\pm 5°$, in conjunction with masking techniques analogous to those used in wet etching. Portions of the layer exposed to the ion beam are eroded in this case due to transfer of momentum from the ions to the particles constituting the exposed surface rather than by chemical reaction. The ion beam is produced by means of an ion gun in which a suitable gas such as argon is ionized by electron impact and in which the ions so produced are accelerated by means of a stationary electric field. To prevent chemical interaction between the gas and the layer being etched, it is advantageous to choose one of the noble gases as etchant gas; however, reactive gases such as oxygen have also proven effective.

Ion milling allows patterning circuit elements of widths of as little as one micron and uniform to within 0.05 micron. While the process is basically suited for the manufacture of small, reliable, inexpensive microminiature communications devices such as high-frequency, transistors, diffraction gratings, and magnetic bubble memories, commercial exploitation has been hampered due to the limited capacity of available ion milling apparatus.

SUMMARY OF THE INVENTION

An apparatus is described for simultaneously ion-milling large numbers of thin film devices. The apparatus comprises a cylindrical ion source and a plurality of multifaceted device holders. During use of the apparatus, ions radiate from the ion source in radial directions and strike surfaces of devices being fabricated. The device holders rotate and revolve relative to the ion source in planetary fashion, thereby exposing devices attached to all facets of the device holders to the ion radiation.

BRIEF DESCRIPTION OF THE DRAWING

FIG. 1 shows a cross-section parallel to the axis of the cylindrical ion source; and FIG. 2 shows a cross-section at right angles to the axis of the cylindrical ion source.

DETAILED DESCRIPTION

Figure 2:
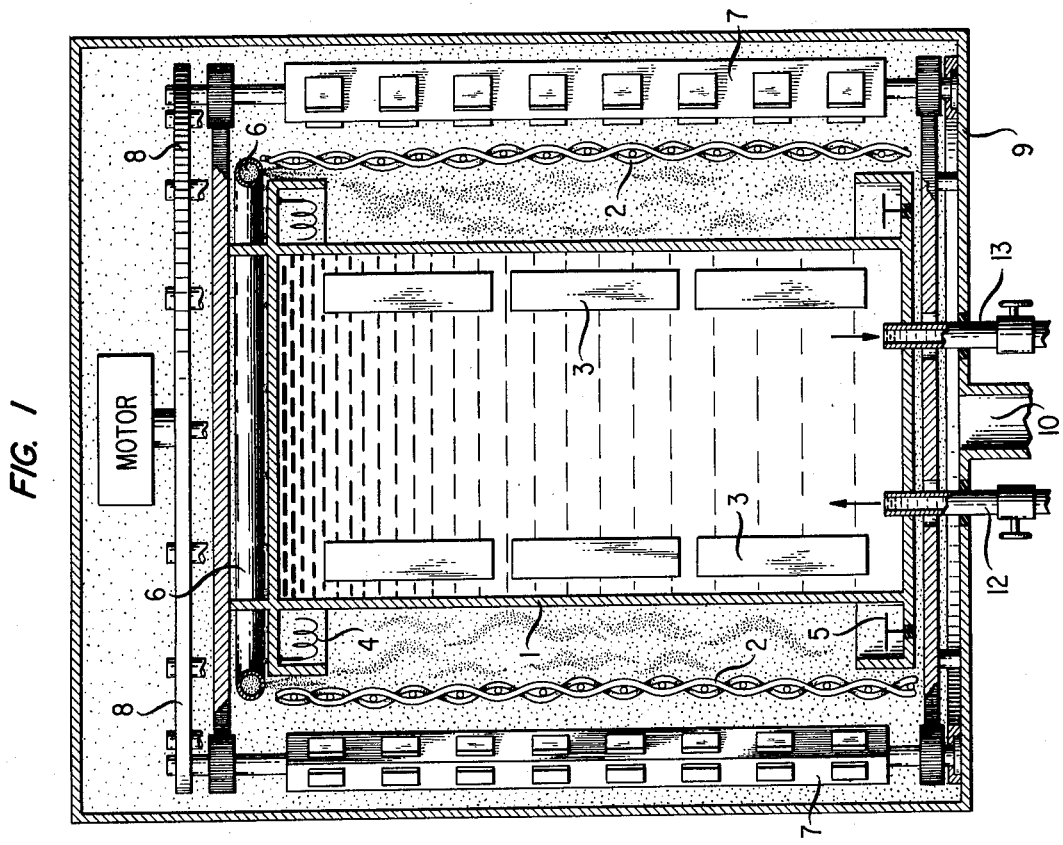
FIGS. 1 and 2 are schematic cross-sectional views of the disclosed apparatus.
Figure 1:
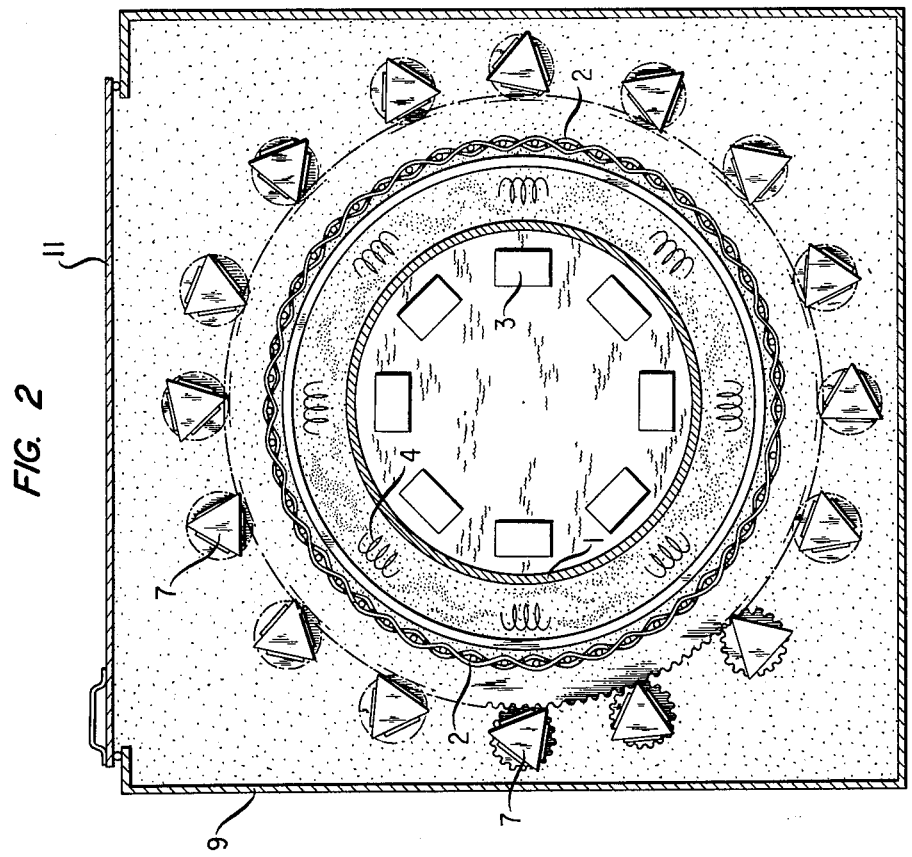

For the sake of ease of description the apparatus is considered to be positioned so that the cylindrical ion source stands vertically. It should be understood, however, that design and functioning of the apparatus is independent of such positioning.

The ion source utilized in the claimed apparatus is of cylindrical shape and comprises a hollow, metallic cylinder 1, open around its outer periphery and enclosed with a cylindrical accelerating grid 2 placed around it concentrically. Magnets 3 are preferably placed inside and in close proximity to cylinder 1. Heatable cathode 4 is positioned outside of and circumferentially around the upper extremity of cylinder 1, anode 5 at the lower extremity and facing cathode 4. When cathode 4 is heated and a voltage is applied between cathode 4 and anode 5, thermal electrons emanating from cathode 4 are accelerated towards anode 5 and ionize gas atoms injected through gas inlet 6 into the space circumscribed by cylinder 1, grid 2, cathode 4 and anode 5. When an accelerating voltage is applied between cylinder 1 and grid 2, positive ions are accelerated radially away from cylinder 1, past grid 2, and towards multifaceted device holders 7 which, by means of planetary gear drive 8, can be made to rotate and revolve about the ion source. Instead of by means of a planetary gear drive, rotation of the device holders may be effected by other means such as individual motors driving the device holders.

The ion source, substrate holders, and planetary gear drive are enclosed in vacuum chamber 9 which can be evacuated through pump connection 10 and which is equipped with access door 11. Cooling of cylinder 1 is accomplished by water entering through inlet 12 and leaving through outlet 13.

While magnets 3 are not essential to the operation of the disclosed device, they serve to enhance efficiency of operation and uniformity of ion flow. The magnetic field due to magnets 3 imparts a spiraling motion to ionizing electrons and thereby increases the length of the path travelled by these electrons. Consequently, the stronger the magnetic field, the greater the likelihood of ionizing collisions between electrons and gas atoms and the stronger the radial ion flow. Thus, by judicious choice of magnets 3 the distribution of ion radiation over the length of cylinder 1 can be influenced. In particular, in the interest of uniformity of radiation it may be advisable to place stronger magnets near the extremity of cylinder 1 and weaker magnets near its middle. If more precise control of the magnetic field is desired electromagnets may be used instead of permanent magnets 3.

Metallic cylinder 1 may be manufactured, for example, of stainless steel and may be single walled as shown in the drawing or double walled with the coolant fluid circulating in the space between the walls rather than throughout the interior as shown. If a double walled cylinder is used, magnets 3 may be placed outside the cylinder, towards the axis of the apparatus. Cooling of the cylinder may be effected by means other than water and may even be dispensed with entirely.

Cathode 4 may be made of standard 30 mil tungsten wire. To minimize sputtering of grid material, grid 2 should preferably be made of a slow sputtering material such as molybdenum, tungsten or titanium, the latter being preferable when ionized oxygen is used for milling.

To fit into a standard 30-inch box coater vacuum apparatus, cylinder 1 may preferably be 24 inches in length and 16 inches in diameter with grid 2 placed about 2 inches away from the surface of the cylinder. For milling three inch wafers the faces of the substrate holders 7 should preferably be about 4 inches wide.

Ionization voltages in the range of from 100 to 200 volts were used successfully between cathode 4 and anode 5; for ion acceleration, voltages applied between cylinder 1 and grid 2 in the range of from 200 to 2000 volts were effective. A range of from 200 to 500 volts is preferred for the acceleration voltage; below 200 volts ion flow was found to be insufficient, and no increase in milling efficiency was found for voltages above about 500 volts. Voltages above approximately 2000 volts were found to lead to detrimental ion implantation.

Regulation of gas flow out of gas inlet 6 to ensure a partial pressure in the range of from $10^{-4}$ to $10^{-3}$ Torr was found to be beneficial.

What is claimed is:

1. An apparatus for patterning thin films by ion bombardment comprising: (1) an ion source comprising a metal cylinder, a heated cathode placed around the circumference of one extremity of said cylinder, an anode placed around the circumference of the other extremity of said cylinder and facing said cathode, an accelerating grid placed concentrically around said cylinder and enclosing said anode and said cathode, and means for injecting a gas between said cylinder and said grid; (2) a plurality of elongated, multifaceted substrate holders placed outside of said grid, and each mounted on an axis for rotation with the axes essentially parallel to the axis of said cylinder; (3) means for causing said substrate holders to rotate, and means for causing the holders to revolve with respect to said ion source; (4) a vacuum chamber enclosing said ion source and said substrate holders; (5) electrode means for applying a first voltage between said cathode and said anode; and (6) electrode means for applying a second voltage between said cylinder and said grid.

2. Apparatus of claim 1 equipped with at least one magnet positioned inside said cylinder.

3. Apparatus of claim 1 equipped with means for cooling said cylinder.

4. Apparatus of claim 1 in which said means for causing said substrate holders to rotate in a planetary gear drive.

5. Apparatus of claim 1 in which the material of said grid is selected from the group consisting of molybdenum, tungsten and titanium.

* * * * *